(12) United States Patent  
Bradshaw et al.

(10) Patent No.: US 11,664,085 B2  
(45) Date of Patent: *May 30, 2023

(54) MANAGING DATA DISTURBANCE IN A MEMORY WITH ASYMMETRIC DISTURBANCE EFFECTS

(71) Applicant: Micron Technology, Inc., Boise, ID (US)

(72) Inventors: Samuel E. Bradshaw, Sacramento, CA (US); Justin Eno, El Dorado Hills, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/368,651

(22) Filed: Jul. 6, 2021

(65) Prior Publication Data

US 2021/0335445 A1  Oct. 28, 2021

Related U.S. Application Data

(63) Continuation of application No. 16/853,226, filed on Apr. 20, 2020, now Pat. No. 11,087,859, which is a (Continued)

(51) Int. Cl.
*G06F 11/00* (2006.01)
*G11C 29/00* (2006.01)
(Continued)

(52) U.S. Cl.
CPC .......... *G11C 29/70* (2013.01); *G06F 11/1612* (2013.01); *G11C 13/0004* (2013.01); (Continued)

(58) Field of Classification Search
CPC .. G06F 11/1612; G06F 11/16; G06F 11/0793; G11C 29/70; G11C 29/52; G11C 29/72; G11C 29/883

See application file for complete search history.

(56) References Cited

U.S. PATENT DOCUMENTS 4,389,715 A   6/1983  Eaton et al.
4,459,685 A   7/1984  Sud et al.
(Continued)

OTHER PUBLICATIONS

Final Office Action, U.S. Appl. No. 16/853,226, dated Jan. 26, 2021, 9 pages.

(Continued)

*Primary Examiner* — Elmira Mehrmanesh
(74) *Attorney, Agent, or Firm* — Nicholson De Vos Webster & Elliott LLP

(57) ABSTRACT

Exemplary methods, apparatuses, and systems include determining that data in a group of memory cells of a first memory device is to be moved to a spare group of memory cells. The group of memory cells spans a first dimension and a second dimension that is orthogonal to the first dimension and the spare group of memory cells also spans the first dimension and the second dimension. The data is read from the group of memory cells along the first dimension of the group of memory cells. The data is written to the spare group of memory cells along the second dimension of the spare group of memory cells.

20 Claims, 11 Drawing Sheets

Related U.S. Application Data continuation of application No. 15/979,285, filed on May 14, 2018, now Pat. No. 10,658,067.

(51) Int. Cl.
  *G11C 13/00* (2006.01)
  *G06F 11/16* (2006.01)
  *G11C 29/52* (2006.01)

(52) U.S. Cl.
  CPC ........ *G11C 13/004* (2013.01); *G11C 13/0069* (2013.01); *G11C 29/52* (2013.01); *G11C 29/72* (2013.01); *G11C 29/883* (2013.01)

(56) References Cited

U.S. PATENT DOCUMENTS

| | | |
|---|---|---|
| 4,591,980 A | 5/1986 | Huberman et al. |
| 4,648,075 A | 3/1987 | Segawa et al. |
| 4,715,034 A | 12/1987 | Jacobson |
| 5,163,023 A | 11/1992 | Ferris et al. |
| 5,233,618 A | 8/1993 | Glider et al. |
| 5,268,853 A | 12/1993 | Tanaka et al. |
| 5,331,585 A | 7/1994 | Tanaka et al. |
| 5,359,549 A | 10/1994 | Tanaka et al. |
| 5,377,148 A | 12/1994 | Rajsuman |
| 5,471,479 A | 11/1995 | McRoberts et al. |
| 5,533,194 A | 7/1996 | Albin et al. |
| 5,761,145 A | 6/1998 | Zagar et al. |
| 6,560,740 B1 | 5/2003 | Zuraski et al. |
| 6,594,788 B1 | 7/2003 | Yasui |
| 6,600,337 B2 | 7/2003 | Nguyen et al. |
| 6,898,110 B2 | 5/2005 | Ishimatsu et al. |
| 6,944,075 B1 | 9/2005 | Eustis et al. |
| 10,108,470 B2 * | 10/2018 | Kathawala ............ G06F 11/076 |
| 10,658,067 B2 * | 5/2020 | Bradshaw .............. G11C 29/52 |
| 10,996,870 B2 * | 5/2021 | Buxton ............... G11C 16/3431 |
| 11,087,859 B2 * | 8/2021 | Bradshaw ............ G11C 13/004 |
| 2002/0126529 A1 | 9/2002 | Roohparvar et al. |
| 2004/0026716 A1 | 2/2004 | Ishimatsu et al. |
| 2009/0322411 A1 | 12/2009 | Moyer et al. |
| 2010/0169705 A1 | 7/2010 | Fujii |
| 2014/0241036 A1 | 8/2014 | Toda |
| 2015/0117107 A1 * | 4/2015 | Sun ...................... G11C 16/225 |
| | | 365/185.12 |
| 2016/0179608 A1 | 6/2016 | Gorobets et al. |
| 2016/0372208 A1 * | 12/2016 | Cai ...................... G06F 11/076 |
| 2017/0110207 A1 | 4/2017 | Jung et al. |
| 2017/0139641 A1 | 5/2017 | Cha et al. |
| 2020/0251176 A1 | 8/2020 | Bradshaw et al. |
| 2020/0278800 A1 * | 9/2020 | Buxton ............... G06F 11/0754 |

OTHER PUBLICATIONS

Non-Final Office Action, U.S. Appl. No. 16/853,226, dated Sep. 30, 2020, 9 pages.

Notice of Allowance, U.S. Appl. No. 15/979,285, dated Jan. 23, 2020, 10 pages.

Notice of Allowance, U.S. Appl. No. 16/853,226, dated Apr. 8, 2021, 8 pages.

* cited by examiner

| LOCAL MEMORY 125 | |
|---|---|
| 610 | 620 |
| NW: <#> | NW: <#> |
| N: <#> | N: <#>+5 |
| NE: <#> | NE: <#> |
| W: <#>+5 | W: <#> |
| A: <#> | A: <#> |
| E: <#>+5 | E: <#> |
| SW: <#> | SW: <#> |
| S: <#> | S: <#>+5 |
| SE: <#> | SE: <#> |

FIGURE 7

| Memory Array 610 Adjustments | | |
|---|---|---|
| Northwest Victim<br>0 | North Victim<br>0 | Northeast Victim<br>0 |
| West Victim<br>5 | Aggressor | East Victim<br>5 |
| Southwest Victim<br>0 | South Victim<br>0 | Southeast Victim<br>0 |

| Memory Array 620 Adjustments | | |
|---|---|---|
| Northwest Victim<br>0 | North Victim<br>5 | Northeast Victim<br>0 |
| West Victim<br>0 | Aggressor | East Victim<br>0 |
| Southwest Victim<br>0 | South Victim<br>5 | Southeast Victim<br>0 |

FIGURE 8

MANAGING DATA DISTURBANCE IN A MEMORY WITH ASYMMETRIC DISTURBANCE EFFECTS

CROSS-REFERENCE TO RELATED APPLICATIONS

This application is continuation of Ser. No. 16/853,226, filed Apr. 20, 2020, which is a continuation of U.S. patent application Ser. No. 15/979,285, filed May 14, 2018, now U.S. Pat. No. 10,658,067, each of which is hereby incorporated by reference.

TECHNICAL FIELD

The various embodiments described in this document relate to managing memory, and more specifically, relate to managing data disturbance in a memory with asymmetric disturbance effects.

BACKGROUND ART

In the field of non-volatile media (NVM), as memory cells are forced closer and closer together to achieve smaller and/or higher capacity products, memory cells have reduced isolation from each other. The reduced isolation increases certain effects. One such effect is disturbance coupling, where accessing one cell (an aggressor) causes artifacts associated with that access to disturb neighboring cells (victims). For media that use an electric or magnetic process to program the state of a memory cell, such as disk drives or flash media, magnetic and/or electric effects propagate to surrounding memory cells. For media that use a thermal process to program the state of a memory cell, such as phase change media, thermal effects propagate to neighboring memory cells. When accessing a memory cell, disturb coupling may result in a change in the state of the surrounding memory cells.

Defect remapping schemes may implement re-vectoring schemes, wherein a logical address associated with a defective physical region is directed to a different physical region. Changing physical regions changes the set of neighbors having proximity disturb relationships to the data stored in the logical address. For example, data may be stored at a logical address mapped several groups of memory cells. If defect remapping changes one of those groups, the set of neighbors associated with the logical address changes. Thus, reads from or writes to the logical address disturb a different set of neighbors before and after remapping. Remapping portions of memory increases the complexity of identifying neighbors and tracking disturbance effects.

BRIEF DESCRIPTION OF THE DRAWINGS

The present invention is illustrated by way of example and not limitation in the figures of the accompanying drawings, in which like references indicate similar elements, and in which:

FIG. 7 illustrates an exemplary approach to tracking disturbance effects;

FIG. 8 illustrates an exemplary set of disturb level adjustment amounts for memories with asymmetric disturbance effects;

DETAILED DESCRIPTION

This document describes embodiments that track and manage data disturbance in a memory having groups of memory cells with asymmetric disturbance effects. When a memory has groups of memory cells all with symmetric disturbance effects, a single tracking scheme can track the disturb level of memory cells regardless of how data is moved within the memory. For example, if a remediation process involves moving the data stored in one group of memory cells to another group of memory cells due to an elevated bit error rate (BER) associated with the former, the scheme to track the disturb level associated with that data need not change after the data has moved. Some memories, however, have groups of memory cells with asymmetric disturbance effects, where the disturbance of an aggressor on a victim in one group is different than the disturbance of the aggressor on a victim in the same relative location to the aggressor but in the other group. Thus, when remediation processes occur that move data between groups of memory cells having different disturbance effects, absent any other changes, a tracking scheme that treats all groups as having similar disturbance effects will underestimate the disturbance level of cells, absent other changes. To avoid changing the tracking scheme, embodiments include systems, apparatuses, and methods that adjust how data is read from or written to groups of memory cells to align the groups of memory cells having asymmetric disturbance effects. For example, if aggressors in one group of memory cells disturb victims in one direction and aggressors in another group of memory cells disturb victims in an orthogonal direction, the disclosed embodiments rotate the addressing of one group when remapping the data to the other group to align the disturb directions.

Figure 1:
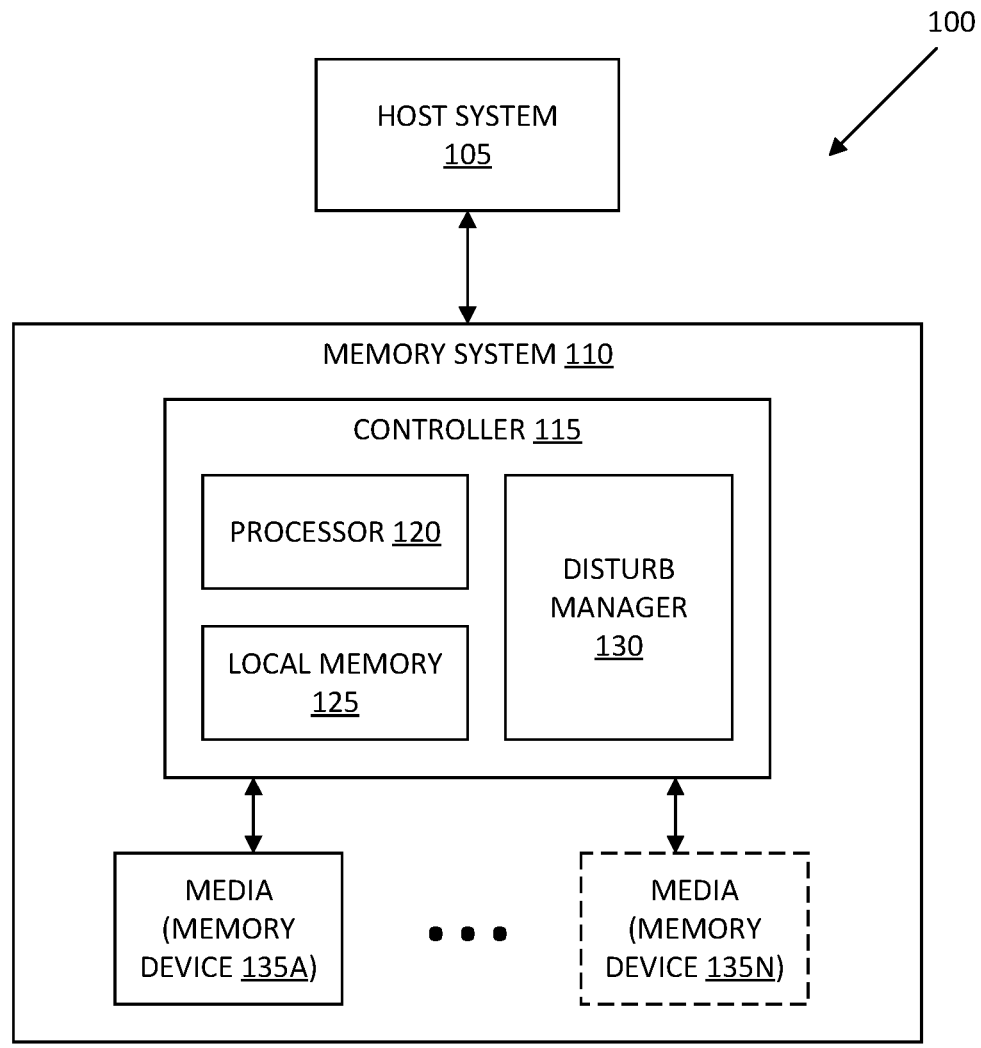
FIG. 1 illustrates an example computing environment that includes a memory system according to one embodiment.

FIG. 1 illustrates an example computing environment 100 that includes a memory system 110 in accordance with some implementations of the present disclosure. The memory system 110 can include media, such as memory device 135A. In some embodiments, the memory system 110 includes multiple memory devices 135A to 135N. The memory devices 135A to 135N can be volatile memory devices, non-volatile memory devices, or a combination of such. In some embodiments, the memory system is a storage system. An example of a storage system is a solid-state drive (SSD). In general, the computing environment 100 can include a host system 105 that uses the memory system 110. In some implementations, the host system 105 can write data to the memory system 110 and read data from the memory system 110. In some embodiments, the memory system 110 is a hybrid memory/storage system.

The host system 105 can be a computing device such as a desktop computer, laptop computer, network server, mobile device, or such computing device that includes a memory and a processing device. The host system 105 can include or be coupled to the memory system 110 so that the host system 105 can read data from or write data to the memory system 110. The host system 105 can be coupled to the memory system 110 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a Serial Advanced Technology Attachment (SATA) interface, a Peripheral Component Interconnect express (PCIe) interface, Universal Serial Bus (USB) interface, Fibre Channel, Serial Attached SCSI (SAS), etc. The physical host interface can be used to transmit data between the host system 105 and the memory system 110. The host system 105 can further utilize a non-volatile memory (NVM) interface, such as NVM Express (NVMe), to access the memory devices 135A to 135N when the memory system 110 is coupled with the host system 105 by a PCIe interface. The physical host interface can provide an interface for passing control, address, data, and other signals between the memory system 110 and the host system 105. Furthermore, in some embodiments, such as a system on a chip (SoC) the host system 105 may be part of a system that is included within computing environment 100.

The memory devices 135A to 135N can include any combination of the different types of NVM devices and/or volatile memory devices. An example of NVM memory devices includes a negative-and (NAND) type flash memory. Each of the memory devices 135A to 135N can include one or more arrays of memory cells (sometimes referred to as storage elements) such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store one or more bits of data used by the host system 105. Although NVM devices such as NAND type flash memory are described, the memory devices 135A to 135N can be based on any other type of memory such as a volatile memory. In some implementations, the memory devices 135A to 135N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of NVM cells. A cross-point array of NVM can perform bit storage based on a change of bulk resistance, in conjunction with a stackable cross-gridded data access array. Additionally, in contrast to many flash-based memory, cross-point NVM can perform a write in-place operation, where a NVM cell can be written without being previously erased. Furthermore, the memory cells of the memory devices 135A to 135N can be grouped as memory pages or data blocks that can refer to a unit of the memory device used to store data.

In one embodiment, PCM technology that changes the bulk resistance of the material constructs an array of non-volatile storage elements of memory devices 135A to 135N, including an array that is three-dimensional (3D). In one embodiment, chalcogenide glass provides the material to construct the storage elements, as well as the corresponding selectors. The dice forming the memory devices 135A to 135N may be arranged in various ways. In one embodiment, the dice 1 through N (as used herein, N is some number greater than 1) of memory devices 135A to 135N may represent the dice of the various described embodiments of this disclosure. The memory system controller 115 couples to memory devices 135A to 135N via access lines, such as bitlines, wordlines, control lines, to access the memory devices 135A to 135N to perform various operations, such as read, write, erase, etc. The number of dice forming memory devices 135A to 135N varies depending on how much memory is desirable or designed for a system. For example, each memory device 135A to 135N can include one, two, four, etc. dice, each die having an array of memory cells. Other combinations are possible.

The controller 115 can communicate with the memory devices 135A to 135N to perform operations such as reading data, writing data, or erasing data at the memory devices 135A to 135N and other such operations.

In general, the controller 115 can receive commands or operations from the host system 105 and can convert the commands or operations into instructions or appropriate commands to achieve the desired access to the memory devices 135A to 135N. The controller 115 can be responsible for other operations such as wear leveling operations, garbage collection operations, error detection and error-correcting code (ECC) operations, encryption operations, caching operations, and address translations between a logical block address and a physical block address that are associated with the memory devices 135A to 135N. The controller 115 can further include host interface circuitry to communicate with the host system 105 via the physical host interface. The host interface circuitry can convert the commands received from the host system into command instructions to access the memory devices 135A to 135N as well as convert responses associated with the memory devices 135A to 135N into information for the host system 105.

The controller 115 can include hardware such as one or more integrated circuits and/or discrete components, or a combination thereof. Integrated circuits include memory such as registers, instruction and/or data memory, buffers, and the like. Integrated circuits also include processing circuitry, such as a microcontroller, special purpose logic circuitry (e.g., a field programmable gate array (FPGA), an application specific integrated circuit (ASIC), etc.), or another suitable processor. For example, the controller 115 can include a processor (processing device) 120 configured to execute instructions stored in local memory 125. In the illustrated example, the local memory 125 of the controller 115 includes an embedded memory configured to store instructions for performing various processes, operations, logic flows, and routines that control operation of the memory system 110, including handling communications between the memory system 110 and the host system 105. In some embodiments, the local memory 125 can include memory registers storing, e.g., memory pointers, fetched data, etc. The local memory 125 can also include read-only memory (ROM) for storing micro-code. While the example memory system 110 in FIG. 1 is illustrated as including the controller 115, in another embodiment of the present disclosure, a memory system 110 may not include controller 115, and may instead rely upon external control (e.g., provided by an external host, or by a processor or controller separate from the memory system 110).

Processor 120 and associated firmware/software may be separate units or incorporated together as a unit. Furthermore, processor 120 and/or associated firmware/software may reside external to the memory system 110, internal to the memory system 110, or even within controller 115. Thus, the firmware and/or software containing instructions which, when executed by the processor 120, can cause the controller 115 to perform operations on the memory devices 135A to 135N.

The memory system 110 can also include additional circuitry or components that are not illustrated. In some implementations, the memory system 110 can include SRAM memory, a cache or buffer (e.g., DRAM), and address circuitry (e.g., a row decoder and a column decoder) that can receive an address from the controller 115 and decode the address to access the memory devices 135A to 135N.

The disturb manager component (DMC) 130 tracks disturb levels of data stored in memory devices 135A-135N. At a high level, DMC 130 identifies disturb victims associated with a memory access, keeps track of the "amount" of disturb associated with each victim, and causes controller 115 to read and rewrite the data of a victim when its "amount" of disturb exceeds some level. In some embodiments, DMC 130 tracks victims at a logical unit level, where a logical unit may be a page of memory, as described below, a group of pages of memory referred to as a write unit, or a group of write units referred to as a managed unit. The operations of disturb manager component 130 as described herein may be carried out by circuitry separate from the processor 120 or external to the controller 115, or incorporated as instructions stored in the local memory 125 executed by processor 120.

Figure 2:
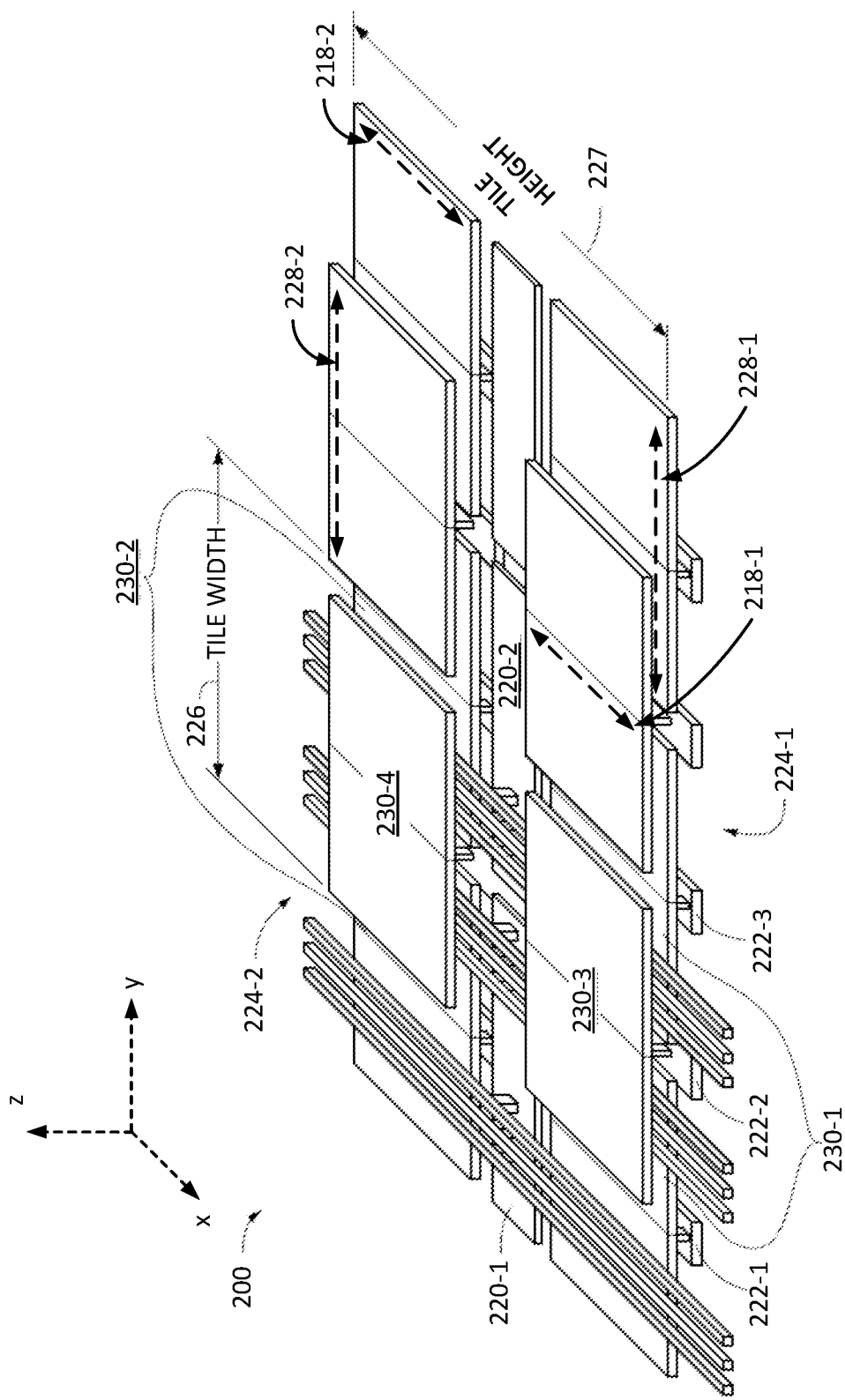
FIG. 2 illustrates an exemplary portion of a memory device according to one embodiment.

FIG. 2 illustrates an exemplary portion of a memory device 200 according to one embodiment. Portion of memory device 200 may correspond to a portion of a die of one of memory devices 135 illustrated in FIG. 1. Memory storage elements (not shown) are formed in two-dimensional arrays (e.g., 230-1, 230-2, 230-3, and 230-4), referred to herein as a "memory array," In some embodiments, memory arrays 230-1, 230-2, 230-3, and 230-4 are referred to as sub-tiles, which, taken together, form one tile having a width 226, a height 227, a lower deck 224-1, and an upper deck 224-2. In other embodiments, tiles can include a different number and/or layout of sub-tiles. The device architecture may have memory arrays 230 spanning one-, two-, or three-dimensions (labelled x, y, and z).

Bitlines 218 and wordlines 228 (individual bitlines and wordlines not specifically shown) span each memory arrays 230 to form a lattice, or crosspoint architecture, where a memory element is located at the junction between a particular wordline and bitline combination. Each memory storage element can be addressed by a bitline 218 and wordline 228 combination. Wordlines 228 may be referred to as access lines or select lines. Bitlines 218 may be referred to as sense lines or data lines. By way of example, a tile can include two megabytes of memory elements that are accessed by 2,048 bitlines 218 and 4,096 wordlines 228. However, memory devices 200 are not limited to a particular number of bitlines 218 and/or wordlines 228-1, 228-2. The wordlines are coupled to wordline decoders 222-1, 222-2, 222-3. The bitlines are coupled to bitline decoders 220-1, 220-2. The wordline decoders 222 and the bitline decoders 220 are coupled to a controller, such as controller 115 illustrated in FIG. 1. In some embodiments, controller 115 can access memory arrays 230-1, 230-2, 230-3, and/or 230-4 either bitline by bitline or wordline by wordline. In this manner, controller 115 can concurrently access one or more elements on any wordline, or one or more elements on any bitline. Although FIG. 2 illustrates a particular physical memory structure, other embodiments have memory arrays with different physical structures.

The relative orientation and positioning of memory arrays 230 to each other and to other circuitry within a die may result in different memory arrays 230 having different disturb profiles, as described below with reference to FIGS. 6, 7, and 8.

Figure 3:
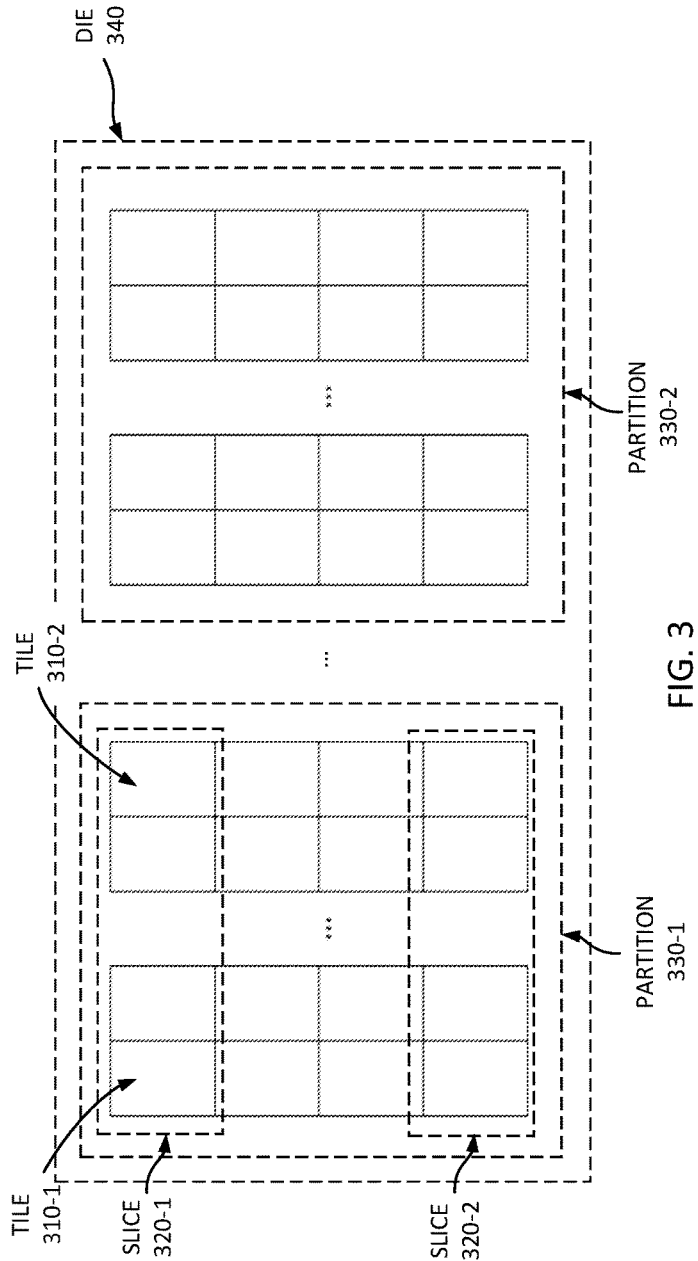
FIG. 3 illustrates an exemplary grouping of the memory architecture illustrated in FIG. 2.

FIG. 3 illustrates an exemplary grouping of memory cells in a memory device based on the structures illustrated in FIG. 2. A die 340 includes a plurality partitions 330. Each partition 330 includes a plurality of slices 320. Each slice 320 includes a plurality of tiles 310, each of which, as discussed above, have a plurality of memory elements. Other memory devices could have different groupings (e.g., because the layout of the read and write circuitry relative to memory elements alters how memory elements are accessed), a different number of groupings, and different group nomenclature.

Figure 4:
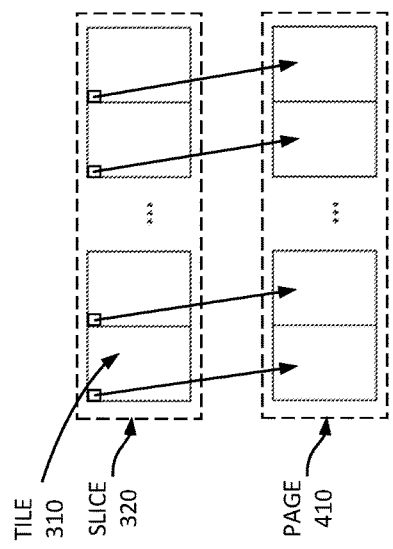
FIG. 4 illustrates an exemplary relationship of a page of memory to the grouping illustrated in FIG. 3.

FIG. 4 illustrates an exemplary relationship of a page of memory to the grouping illustrated in FIG. 3. In some embodiments, a page is the smallest addressable unit by the memory controller 105. In this embodiment, page 410 is a group of bits, where each bit corresponds to one bit in each tile of a slice 320. For example, if a slice contains 128 tiles, a page refers to a 16-byte (128-bit) block of memory elements. In one embodiment, pages increment sequentially first among all bits in a slice of tiles and then among all slices in a partition. If a tile comprises sixteen megabits of memory, each slice includes a corresponding number of pages.

Figure 5:
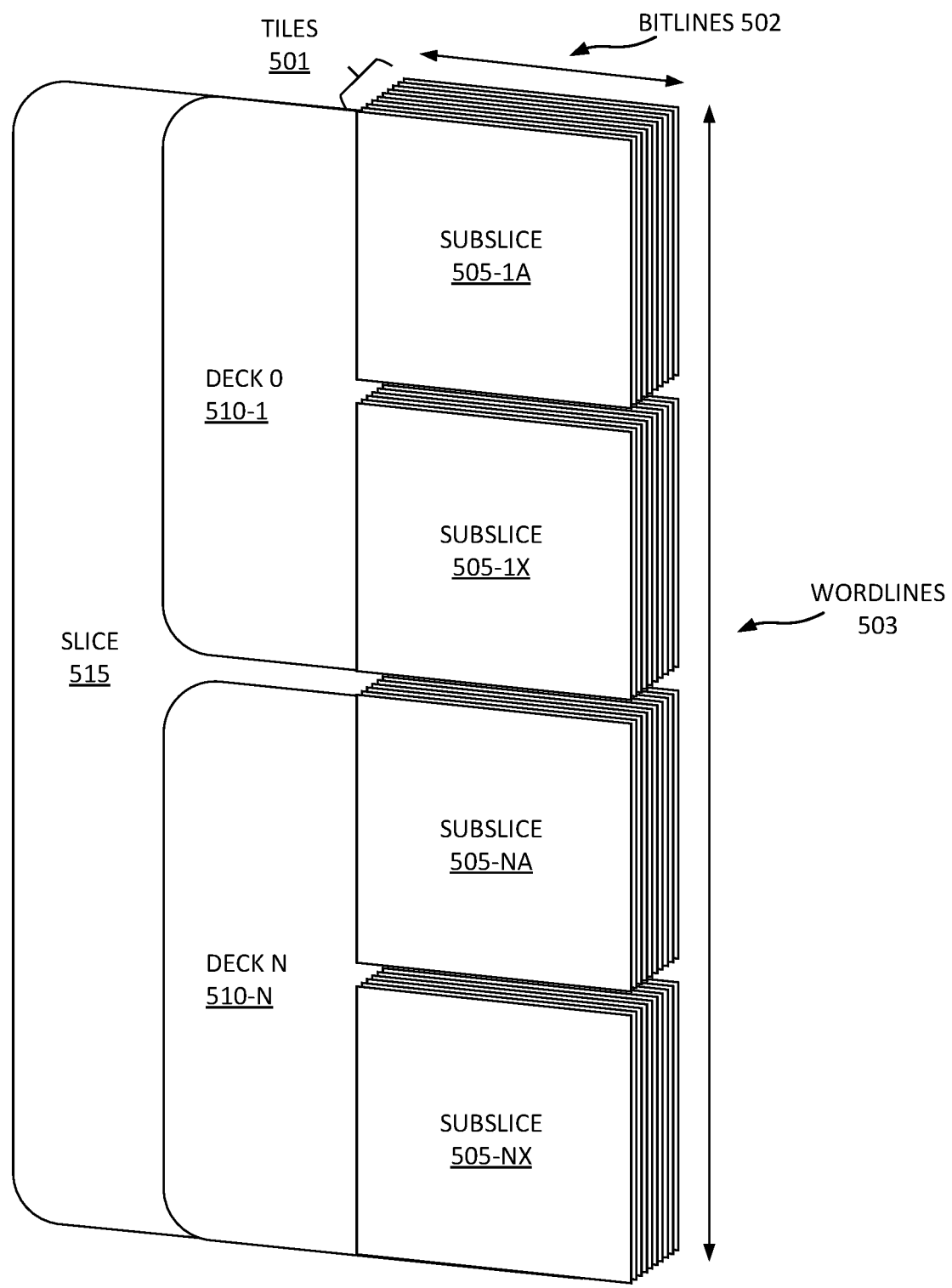
FIG. 5 illustrates another grouping of the memory array and groupings illustrated in FIGS. 2 and 3.

FIG. 5 illustrates another logical grouping of the memory array and groupings illustrated in FIGS. 2 and 3. Slice 515, which correlates to slice 320 illustrated in FIG. 3, is illustrated from a different perspective to show that the slice includes decks 510-1 to 510-N, where N is the number of decks in the architecture. Given a memory array like the one illustrated in FIG. 2, slice 515 includes two decks: an upper deck and a lower deck. Slice 515 can be further divided into sub-slices 505, which can correspond to groupings of sub-tiles in a slice. For example, the group of all sub-tiles 230-1 within a slice 320 could correspond to sub-slice 505-1A, the group of all sub-tiles 230-2 within a slice 320 could correspond to sub-slice 505-1X, the group of all sub-tiles 230-3 within a slice 320 could correspond to sub-slice 505-NA, and the group of all sub-tiles 230-4 within a slice 320 could correspond to sub-slice 505-NX.

Figure 6:
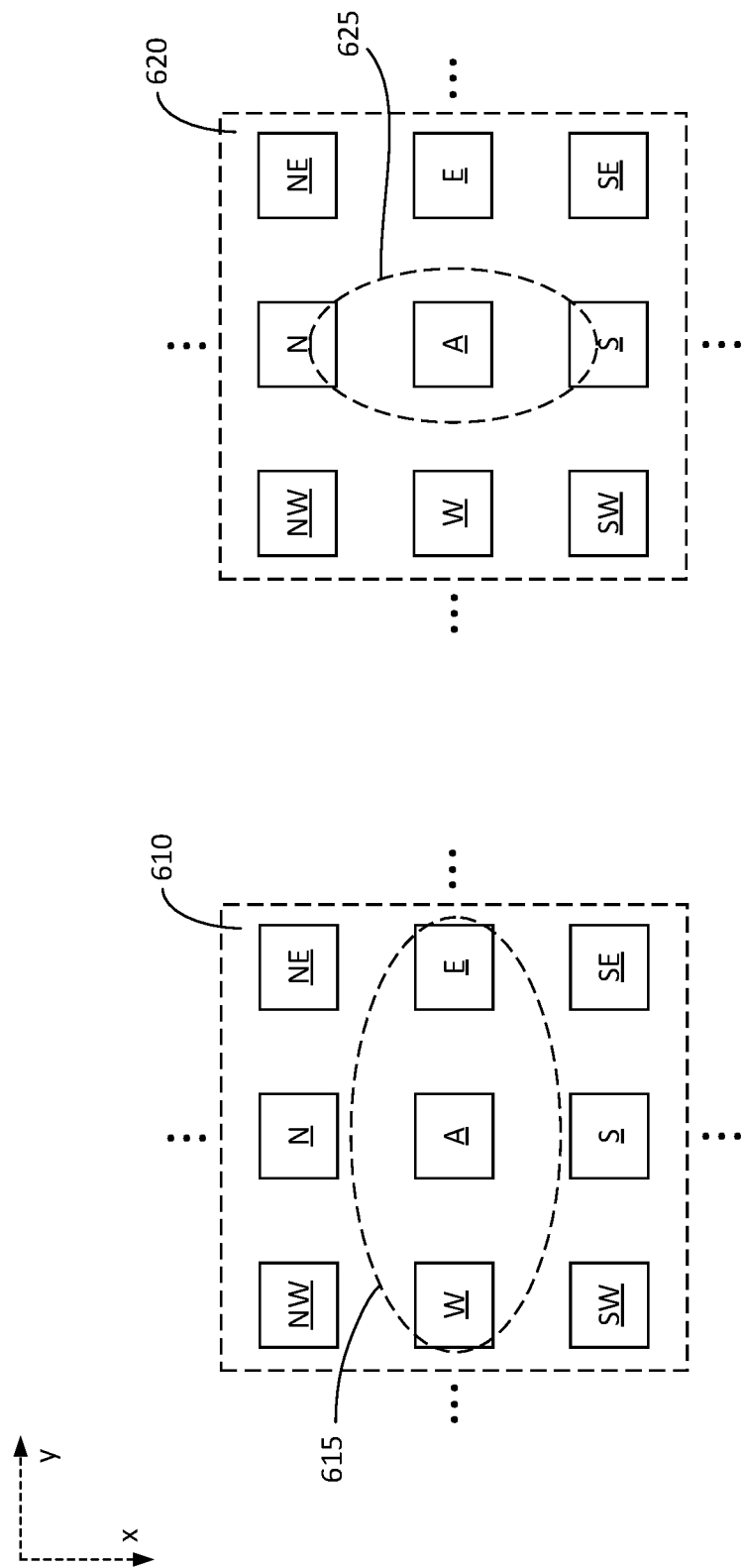
FIG. 6 illustrates asymmetric disturbance effects according to some embodiments.

FIG. 6 illustrates asymmetric disturbance effects according to some embodiments. Two portions of memory arrays, 610 and 620, have different disturb regions (e.g., with different shapes and/or intensities). As mentioned above, thermal, electric, and/or magnetic effects associated with the access of an aggressor memory element may propagate through a localized region and disturb the data stored in neighbor, victim memory elements. Differences in disturb regions can arise based on the relative orientation and positioning of memory arrays 610 and 620 to each other and to other circuitry within a die. For example, memory array 610 could be a memory array on the lower deck illustrated in FIG. 2 while memory array 620 could be a memory array on the upper deck.

As shown in FIG. 6, memory array 610 and memory array 620 extend within an x-dimension and a y-dimension as, e.g., part of the same die. Memory array 610 has a disturb region 615 that is stronger in an East/West direction (a "strong disturb" along the y-axis) than in a North/South direction (along the x-axis), and memory array 620 has a disturb region 625 that is stronger in a North/South direction (a "strong disturb" along the x-axis) than in an East/West direction (along the y-axis). Thus, the disturb arising from an access to a memory location will vary depending on whether the location is on memory array 610 or memory array 620. For example, when controller 115 accesses the aggressor location A in memory array 610, the access disturbs the western location W and the eastern location E. When controller 115 accesses the aggressor location A in memory array 620, the access disturbs the northern location N and the southern location S. The accesses may be a read, write, refresh, erase, or other memory operation. Depending on the type of access, the intensity (and thus size) of the disturb region may vary. For example, in some embodiments a write access causes more disturb to neighbors than a read access. The disturb region may impact victims within memory arrays 610, 620 or on other memory arrays, depending on the architecture of the die.

FIG. 7 illustrates an exemplary approach to tracking disturbance effects. In this example, values in local memory 125 represent the disturb level of the locations in the memory arrays 610 and 620 illustrated in FIG. 6. DMC 130 monitors accesses to the memory, identifies the victim(s) associated with the access, and updates a value associated with each victim by an amount corresponding to the type of access (e.g., read, write, etc.). DMC 130 maintains values in local memory 125 associated with each victim in the memory.

A memory device manufacturer or designer may model, measure, or empirically determine the intensity and shape of disturb region for different memory access types to identify which neighbors are victims and to determine the adjustment amount for each victim. A larger disturb region may affect memory elements that are separated from the aggressor memory element by one, two, or more intermediate memory elements.

An exemplary set of adjustment amounts for memory arrays 610 and 620 is illustrated in FIG. 8. In some embodiments, controller 115 stores adjustment amounts in local memory 125, and DMC 130 looks up the adjustment amounts when modifying the disturb level associated with a victim as described herein. While FIG. 8 illustrates the relative relationships between an aggressor and victims, paralleling FIG. 6, the controller 115 need only store non-zero adjustment amounts (e.g., for the east and west victims in memory array 610, and for the north and south victims in memory array 620). Note that additional adjustment amounts may exist for each type of memory operation (e.g., read, write, etc.). Because memory array 610 and memory array 620 have different disturb regions, the adjustment amounts for the two memory arrays differ. If controller 115 were to access the aggressor location A in memory array 610 and the aggressor location A in memory array 620, DMC 130 detects the accesses, determines that the western location W and eastern location E in memory array 610 and the northern location N and the southern location S in memory array 620 are victims, increments the values associated with the identified victims by the adjustment amount as shown in FIG. 7 (in this case, +5). The description associated with FIG. 9 below provides additional details regarding the identification of victims and updating of values.

In some embodiments, memory elements are logically grouped and DMC 130 tracks disturbance per logical unit. For example, each of the locations (e.g., N, A, etc.) in FIG. 6 may include one, two, three, etc. memory elements. By grouping memory elements into groups of N memory elements, where N is greater than one (e.g., two, three, etc.), the number of disturb values that DMC 130 maintains is reduced by up to 1/N. For example, if a memory array includes 1,000 memory elements and those elements are written to or read from in groups of four, the number of disturb levels to track is 250.

Figures 9, 10:
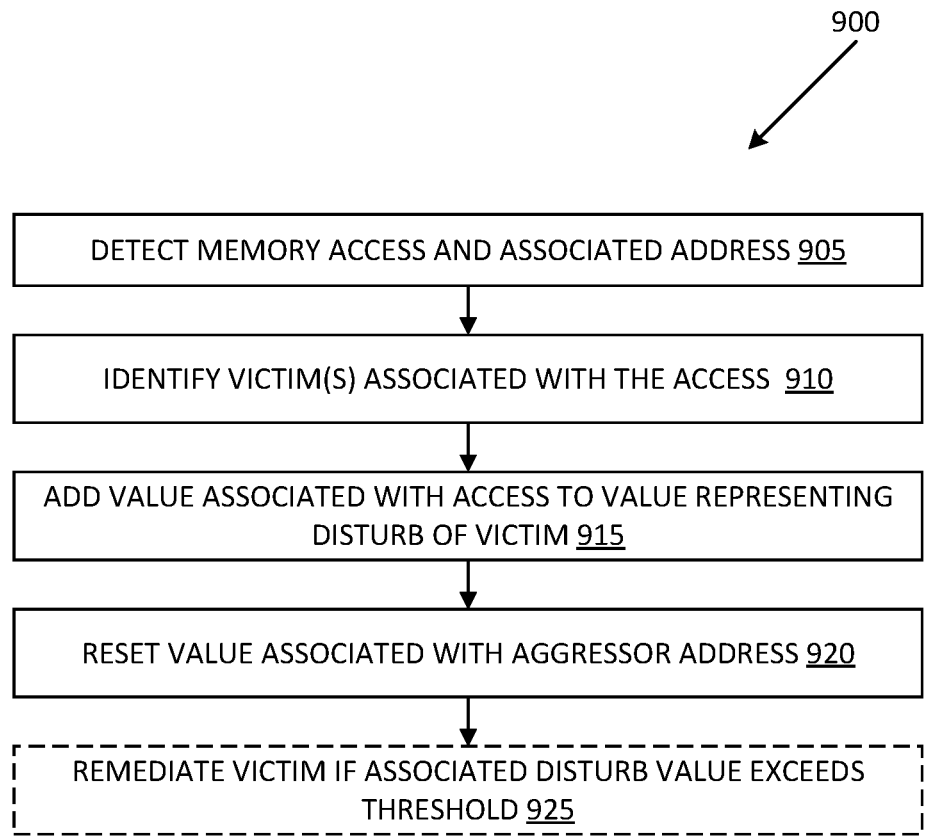
FIG. 9 is a flow chart illustrating an exemplary method of tracking disturbance effects.
FIG. 10 illustrates an exemplary addressing scheme for identifying victims.

FIG. 9 is a flow chart illustrating an exemplary method 900 of tracking disturbance effects. Method 900 can be performed by processing logic that can include hardware (e.g., circuitry, dedicated logic, programmable logic, microcode, etc.), software (such as instructions run on a processing device), firmware, or a combination thereof. In one embodiment, DMC 130 or other processing device in FIG. 1 can perform method 900. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 905, the processing device detects a memory access and the corresponding address. The processing device determines the type of the memory access (e.g., read, write, erase, refresh), as different types of accesses may have different disturb profiles or coupling between memory elements.

At block 910, the processing device identifies the victim or victims associated with the access. To do so, the processing device may correlate the address with the corresponding physical location in memory. The address may directly identify a particular memory division (e.g., a memory element, group of memory elements within one or more memory arrays, memory array, or group of arrays within memory device(s)) or may require additional translation to identify the corresponding physical location(s). For example, if an address identifies a logical unit (e.g., a page, a write unit, a managed unit, etc.), the processing device may have to re-order or "swizzle" the bits in the address to identify the memory division within the memory system. Note that in some embodiments, the processing device may use the address of the logical unit to identify victims, and identification of the particular physical locations corresponding to the memory division is unnecessary.

In a memory array, sequential addresses may map to sequential locations within a row before wrapping to another row (sometimes referred to "row-major" addressing), or sequential addresses may map to sequential locations with a column before wrapping to another column (sometimes referred to as "column-major" addressing). For example, the NW, N, and NE locations in memory array 610 could map to addresses 0, 1, and 2 in row-major addressing, while the NW, W, and SW locations in memory array 610 could map to addresses 0, 1, and 2 in column-major addressing. In some embodiments, to switch between addressing schemes, controller sequentially accesses memory cells in memory array 1210A by accessing a first memory cell (e.g., address 0) coupled to a first access line spanning the y-dimension and a second access line spanning the x-dimension and then accessing a second memory cell (e.g., address 1) coupled to the first access line and to a third access line spanning the x-dimension. Similarly, controller sequentially accesses memory cells in memory array 1220A by accessing a first memory cell (e.g., address 0) coupled to a first access line spanning the x-dimension and a second access line spanning the y-dimension and then accessing a second memory cell (e.g., address 1) coupled to the first access line and to a third access line spanning the y-dimension.

The processing device can use the accessed address and the addressing scheme to identify neighbors/victims by, e.g., using a data structure to lookup victims based on an aggressor address or mathematically calculating victim addresses based on the aggressor address. For example, if the access is to address 5 in a 3×3 array of memory locations with row-major addressing, the North and South neighbors can be identified by respectively subtracting and adding 3 from the access address. The East and West neighbors can be identified by respectively adding and subtracting 1 from the access address. More generally, in a two-dimensional memory array with row-major addressing, victims may be identified as illustrated in FIG. 10, where X is the address of the aggressor and N is the number of addressable groups in a row. The addressable group may be one or more memory elements.

Returning to FIG. 9, at block 915, the processing device adds an amount determined by the access type and/or relative locations of the identified victim and aggressor to the value representing the disturb level of the victim. As mentioned above, the amount by which the disturb level of each victim is adjusted can be modeled, measured, or determined empirically. In some embodiments, the adjustment amounts are stored in a lookup table or other data structure stored in a memory accessible by DMC 130, such as local memory 125, such as those illustrated in FIG. 8. In some embodiments, the type of memory access (e.g., read versus write) may have no effect on the amount of disturbance of victims. In other embodiments, the amounts in the table above may scale linearly for different type memory accesses. For example, the above adjustments may represent a read access, and a write access scales the above adjustment amounts by a factor of 10. In other embodiments, the relative amounts between different operations may be non-linear.

Note that depending on the symmetry (or lack thereof) of the disturb region, more or fewer adjustment amounts can be made available. For example, if a disturb region equally impacts its immediate neighbors regardless of the type of memory access, the adjustment amount may be a single value. As another example, if a disturb region does not impact off-axis (diagonal) neighbors and equally impacts immediate neighbors along each remaining axis, one to three adjustment amounts may be used (one for each of the x-, y-, and z-axis neighbors, subject to axial differences).

At block 920, the processing device resets the disturb level associated with the aggressor (for when it is a victim). As in the case of a read-rewrite operation, writing data to the aggressor resets the amount of disturb that the corresponding element(s) can tolerate before requiring a refresh.

At block 925, controller 115 or DMC 130 determines that a disturb level associated with a victim exceeds some refresh threshold and remediates the data by initiating a read-rewrite cycle. The monitoring and remediation may occur on a schedule. In some embodiments, the threshold is based on the type and number of aggressor accesses that are likely to cause the victim data to corrupt. For example, in some architectures, controller 115 can read from a location (an aggressor) 100 times or write to the location 10 times before a bit in a victim location can no longer resolve into a '1' or '0' In such a scenario, the threshold could be 100, the adjustment amount for a read access could be 1, and the adjustment amount for a write access could be 10. As indicated above, a memory device manufacturer or designer can determine the number of aggressor accesses of various types that cause data to corrupt.

Figure 11:
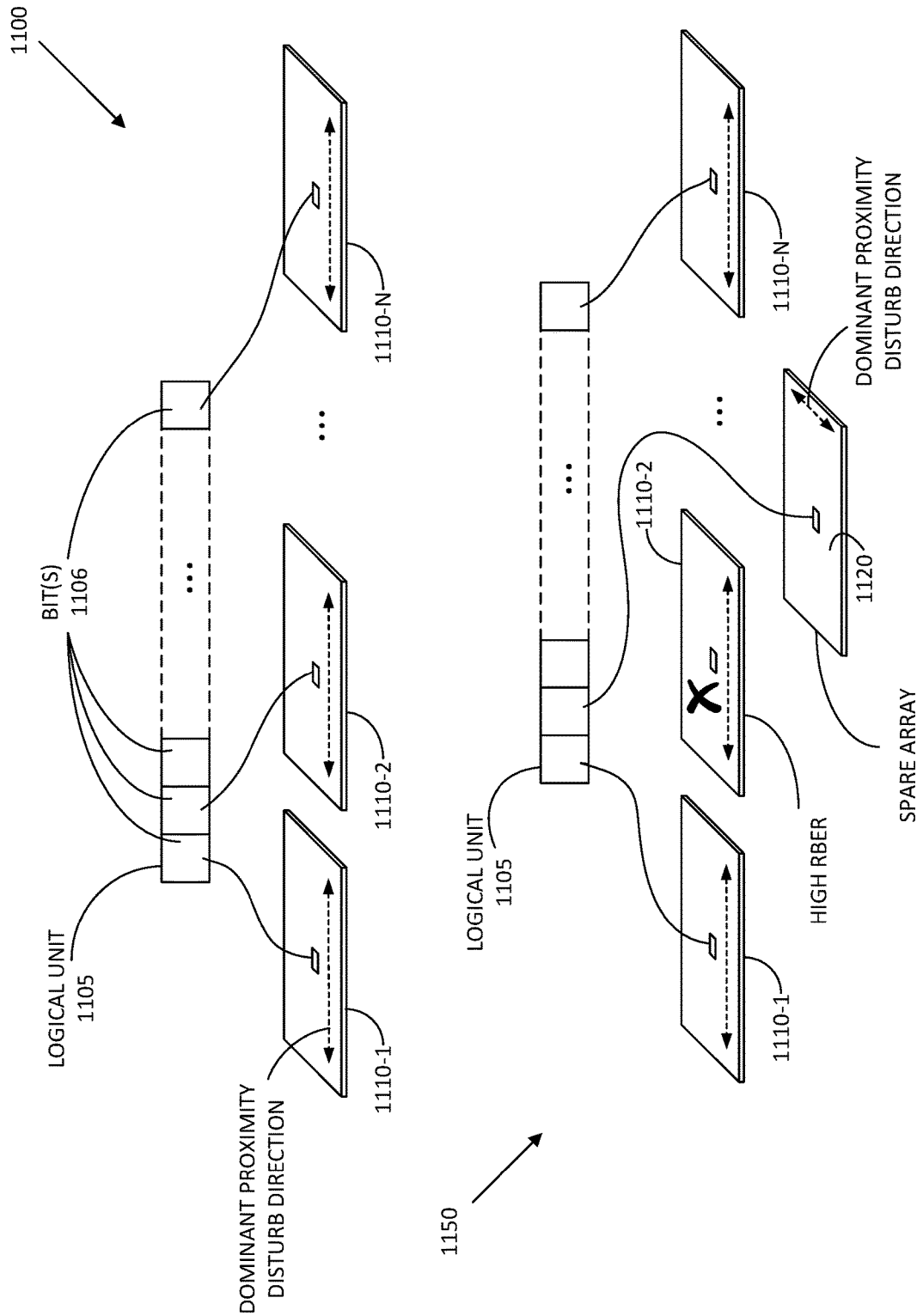
FIG. 11 illustrates mapping and remapping a logical unit to multiple memory arrays according to some embodiments.

FIG. 11 illustrates mapping and remapping a logical unit to multiple memory arrays according to some embodiments. In this example, a block of data in the form of a logical unit 1105 is stored across multiple memory arrays 1110. As shown, logical unit 1106 includes one or more bits of data stored on each array 1110. A logical unit may be a page, a write unit, a managed unit, or some other block/unit of data. For example, logical unit 1105 could be a 16-byte page, where each bit is stored on one of 128 different memory arrays. Other mappings of logical units to memory are possible.

As mentioned above, defect remapping schemes may be used to mitigate defects that arise either during manufacturing or due to use (e.g., wear). To perform remapping, controller 115 may reserve some portion of the memory as spare or treat the unused portion of the memory as spare. When controller 115 determines that some portion of the memory has an elevated bit error rate (BER) or a BER that exceeds some threshold, the controller can move or redirect data from the high-BER portion to a different, lower BER portion of memory, which may be the reserved spare portion or another, less-worn or unused portion of memory. When remapping, the controller 115 maintains a list or map of locations that have been remapped, and their corresponding remapped locations. The controller 115 may maintain the list or map of remapped locations in local memory 125.

Because a particular device's architecture may give rise to a variety of different disturb region forms, remapping memory may result in associated data (e.g., by virtue of being in the same logical unit) that is stored in portions of memory with different disturb profiles. For example, at state 1100, memory system 110 stores logical unit 1105 on memory arrays 1110-1 through 1110-N, and each memory array 1110 has the same dominant disturb direction. Later, at state 1150, controller 115 remapped the portion of memory such that the logical unit data stored on memory array 1110-2 was relocated to memory array 1120, which has a different dominant proximity disturb direction than memory array 1110-2. When this happens, if DMC 130 tracks disturb levels at the page level without distinguishing between memory arrays having varying disturb regions, DMC 130 may underestimate disturb levels of the page's data. For example, if DMC 130 tracks disturb levels with an East/West dominant disturb profile of memory arrays 1110, DMC 130 would underestimate the level of disturb of data stored in victims in the North/South direction within memory array 1120. Conversely, if DMC 130 tracks levels of disturb at the memory array level, DMC 130 must maintain 128 separate values per page (one for each memory array), increasing the processing and memory requirements in the system. The following disturb management approaches described below avoid the inaccuracies associated with tracking disturb at a logical unit level and the additional overhead associated with tracking disturb at a physical memory level.

Figure 12:
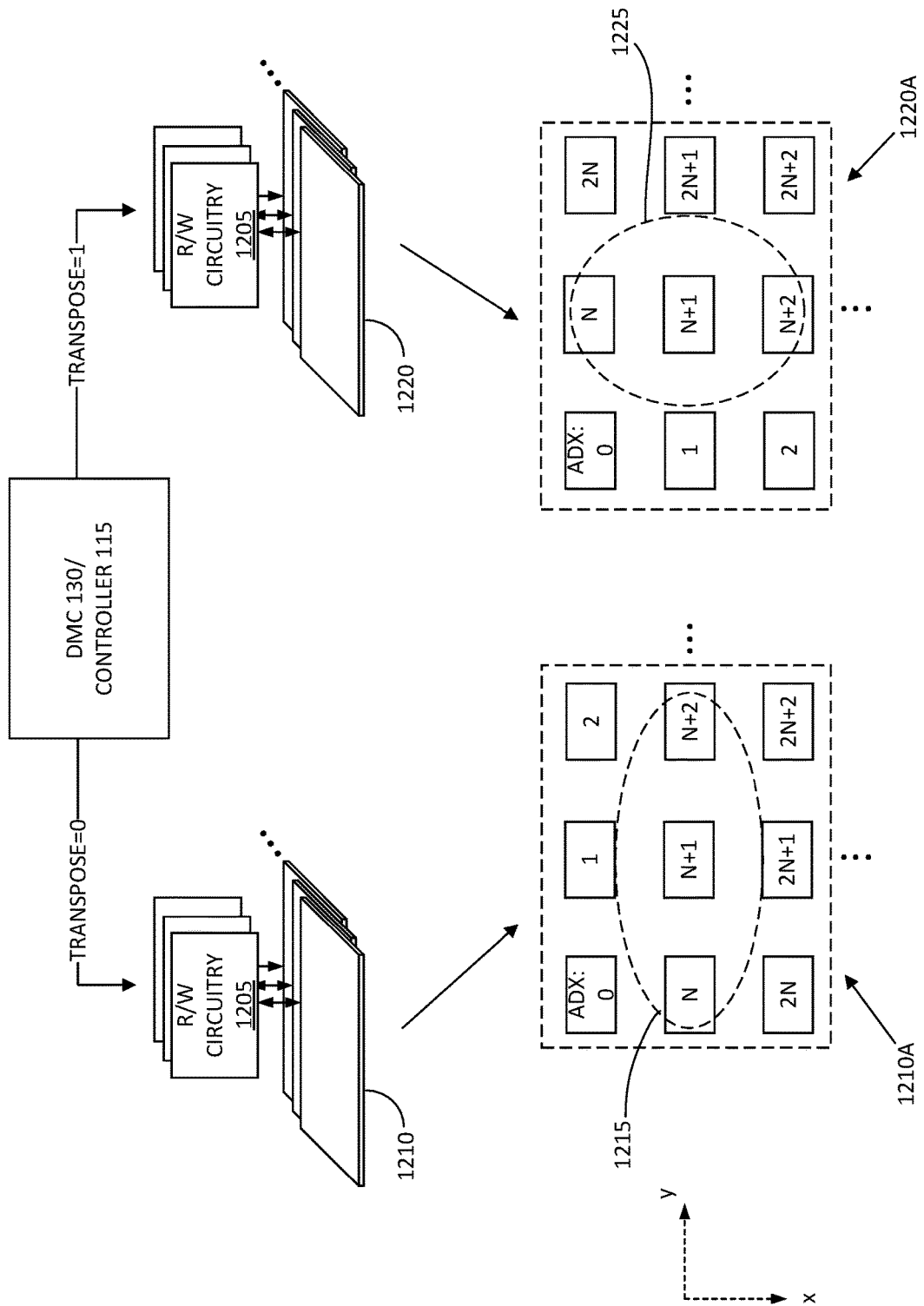
FIG. 12 illustrates an exemplary approach to managing logical units mapped to groups of memory elements with asymmetric disturbance effects.

FIG. 12 illustrates one approach to managing logical units mapped to groups of memory elements with asymmetric disturbance effects. DMC 130 or controller 115 can employ the illustrated approach in situations where the shape and intensity of the disturb region is consistent across memory groups but changes in orientation. In other words, the disturb regions are identical or nearly identical but for their relative orientations to the memory groups, like as shown in the tables above with the memory array 610 and 620 adjustment amounts.

In this example, DMC 130 is coupled to read/write (RW) circuitry 1205 associated with memory array(s) 1210 and memory array(s) 1220. Memory array(s) 1210 and memory arrays 1220 extend within an x-dimension and a y-dimension. Memory array(s) 1210 have an East/West dominant disturb region 1215 and memory array(s) 1220 have a North/South dominant disturb region 1225. To track disturb levels at a logical unit level, DMC 130 signals (or causes controller 115 to signal) RW circuitry 1205 associated with memory array(s) 1210 to use first addressing scheme 1210A and RW circuitry 1205 associated with memory array(s) 1220 to use second addressing scheme 1220A.

Addressing scheme 1210A is in row-major form, where addresses increment within a row and then by column Addressing scheme 1220A is in column-major form, where addresses increment within a column and then by row. By adjusting the addressing scheme used to address one of the two types of memory arrays, the disturb regions 1215 and 1225 are "virtually" aligned so that disturb levels can be tracked at the logical unit level. For example, a write to address N+1 causes a strong disturb to its Eastern and Western neighbors (at addresses N and N+2) in memory arrays 1210. In one embodiment, a "strong disturb" refers to a disturb effect that is stronger in one direction than in another. For example, the strong disturb to the Eastern and Western neighbors of address N+1 is strong relative to any disturb to its Northern and Southern neighbors (at addresses 1 and 2N+1). In one embodiment, a "strong disturb" refers to a disturb effect that is strong enough, alone or in the cumulative with other read/write operations, to result in a change in the state of a nearby memory cell. In another embodiment, a "strong disturb" refers to a disturb effect that results in a change in the state of a nearby memory cell in fewer read/write operations than a disturb effect that is not referenced as "strong."

Similar to the description of a write to memory arrays 1210 above, a write to address N+1 causes a strong disturb to its Northern and Southern neighbors (also at addresses N and N+2) in memory arrays 1220 relative to its Eastern and Western neighbors (at addresses 1 and 2N+1). Thus, controller 115 or DMC 130 can track the disturb level of a logical unit with bits stored at address N across memory array(s) 1210 and 1220 with a single disturb value despite the logical spanning memory arrays with asymmetric disturbance effects.

Figure 13:
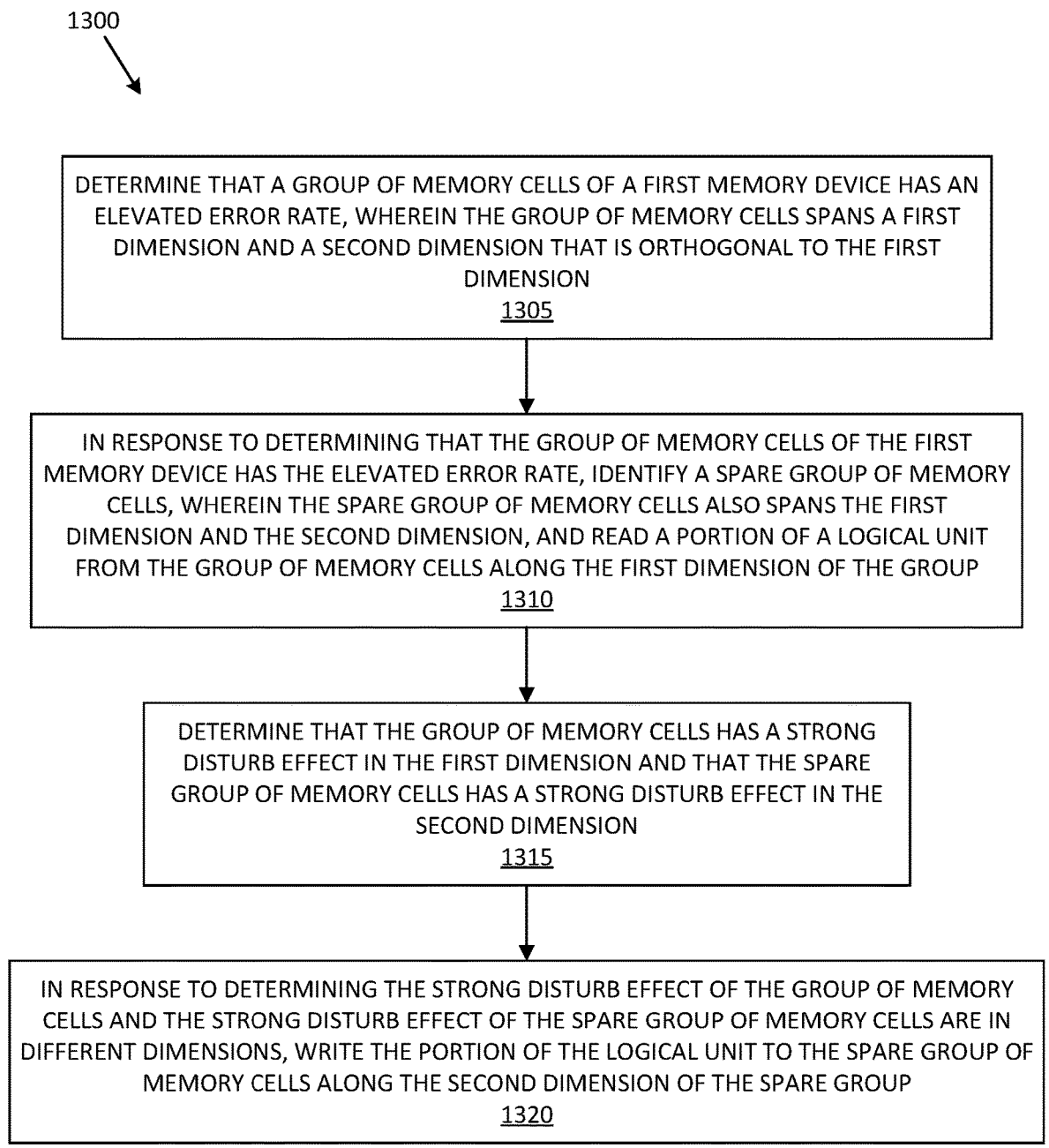
FIG. 13 is a flow chart illustrating an exemplary method of implementing the approach illustrated in FIG. 12.

FIG. 13 is a flow chart illustrating an exemplary method 1300 of implementing the approach illustrated in FIG. 12. Method 1300 can be performed by processing logic that can include hardware (e.g., circuitry, dedicated logic, programmable logic, microcode, etc.), software (such as instructions run on a processing device), firmware, or a combination thereof. In one embodiment, DMC 130 or other processing device in FIG. 1 can perform at least a portion of method 900. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 1305, the processing device determines that a group of memory cells (e.g., an array of memory elements, a portion of an array of memory elements, a grouping of arrays of memory elements, etc.) of a first memory device has an elevated error rate, wherein the group of memory cells spans a first dimension and a second dimension that is orthogonal to the first dimension. For example, the processing device could determine that all or a portion of memory array 1110-2 has an elevated error rate. In some embodiments, the processing device makes the determination based on data collected by a scrubber component or process. A scrubber component performs defect (e.g., error) analysis and provides results to the processing device. In one embodiment, the scrubber component is part of a controller (for example, controller 115 in FIG. 1 for one embodiment). At a high level, the scrubber component is a continuous background process that is responsible for determining the bit error rates (BER) of various physical and/or logical groups of the memory, ranking the groups, e.g., highest-to-lowest BER, and rewriting the data on the system according to the ranking, e.g., to migrate away from high-BER elements and toward low-BER elements. In one embodiment, the scrubber component determines the raw bit error rate (RBER) for the groups of memory cells and the processing device accumulates the RBER values in buckets. The processing device may sort BER or RBER values to select the worst performing groups of memory. In another embodiment, the processing device may use other performance and/or reliability metrics instead of RBER. Once error rates are known, the processing device identifies a number of the worst performing memory groups (e.g. those having the highest BER) or a group of worst performing memory groups having an error rate that exceeds a threshold (up to some number of available spare groups).

At block 1310, having determined the group of memory cells has an elevated error rate, the processing device identifies a spare group of memory cells, wherein the spare group of memory cells also spans the first dimension and the second dimension. The processing device further reads a portion of a logical unit from the group of memory cells along the first dimension of the group. The spare group may come from a portion of memory that was reserved for remapping or from some other unused portion of memory. A remapping process or circuitry included with controller 115 may perform the identification and handle the associated remapping. For example, some portion of a die within a memory device may be designated spare. The processing device identifies an available region within the spare and, when reading data from or writing data to the remapped location, instead read from or write to the spare region.

At block 1315, the processing device determines that the group of memory cells has a strong disturb effect in the first dimension and that the spare group of memory cells has a strong disturb effect in the second dimension. An example of this is shown in FIG. 11, the high RBER memory array 1110-2 has an East/West dominant disturb direction and the spare memory array 1120 has a North/South dominant disturb direction. In some embodiments, the processing device determines whether the disturb profiles are different by comparing the physical addresses corresponding to the two groups. For example, if the disturb profile alternates between decks, as described above with reference to FIG. 6, and the physical addresses of the two groups correspond to the same deck, the processing device determines that the group of memory elements and the spare group of memory elements have the same disturb profile. Conversely, if the processor determines the two groups of memory elements are on different decks, the processing device determines that the groups have different disturb profiles. In some embodiments, the processing device determines whether the memory groups have different disturb profiles by accessing a list or map of remapped locations that controller or one of its components maintains during the remapping process.

At block 1320, having determined that the strong disturb effect of the group of memory cells and the strong disturb effect of the spare group of memory cells are in different dimensions, the processing device writes the portion of the logical unit to the spare group of memory cells along the second dimension of the spare group. For example, the processing device could read the data from the high RBER memory array 1110-2 in FIG. 11 using addressing scheme 1210A in FIG. 12 and write the data to the spare array 1120 using addressing scheme 1220A. Thus, if memory array 1210 has the same adjustment amounts as those illustrated in FIG. 8 for memory array 610 and memory array 1220 has the same adjustment amounts as those illustrated in FIG. 8 for memory array 620, addressing scheme 1220A aligns the victims of a disturb across memory arrays 1210 and 1220. As a result, the number of adjustment amounts stored in local memory 125 is halved because the processing device can use one set of one or more adjustment amounts to adjust the values representing the disturb levels in either memory array 1210 or memory array 1220.

Figure 14:
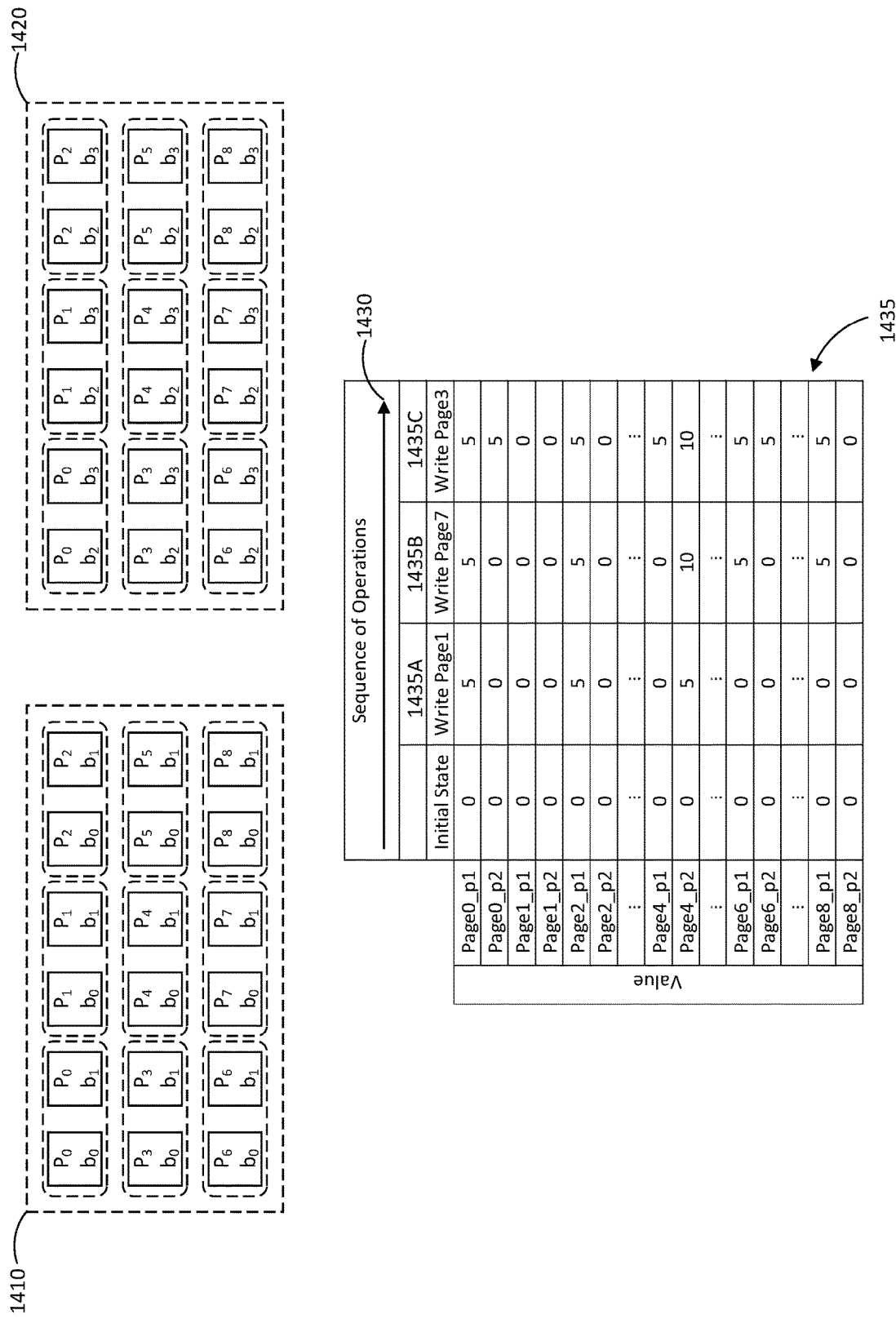
FIG. 14 illustrates another exemplary approach to managing logical units mapped to groups of memory elements with asymmetric disturbance effects.

FIG. 14 illustrates another exemplary approach to managing logical units mapped to groups of memory elements with asymmetric disturbance effects. DMC 130 or controller 115 can employ the approach illustrated in FIG. 14 in situations like the one described with respect to FIG. 12, where the shape and intensity of the disturb region is consistent across memory arrays but changes in orientation, and in more general situations where many different disturb regions exist. For example, some embodiments could include two types of memory arrays where the disturb profiles are asymmetric regardless of their dominant axis. Other embodiments could include three, four, or more types of arrays, each type exhibiting a different disturb profile.

Under this approach, DMC 130 maintains values representing the disturb level of each logical unit. The number of counters maintained per logical unit is increased, however, based on the number of different types, or classes, of disturb regions that associated with the memory arrays on which the logical unit is stored. In this example, pages have 4 bits of data spanning two memory arrays 1410 and 1420. For example, bits 0 and 1 of page 0 map to the upper left portion of memory array 1410, and bits 2 and 3 of page 0 map to the upper left portion of memory array 1420. Further, memory arrays 1410 and 1420 have disturb regions similar to those illustrated above in FIGS. 6, characterized by the respective adjustment amounts for memory arrays 610 and 620 illustrated in FIG. 8. Each column in table 1435 represents the maintained disturb values for the logical unit after the noted operation, which controller 115 can store in local memory 125. As indicated by arrow 1430, a sequence of memory accesses occur over time, and DMC 130 maintains the disturb levels. While table 1435 illustrates a sequence of memory accesses for ease of explanation, one embodiment of table 1435 only tracks the current state of disturb levels for each logical unit. Additionally, embodiments can use a data structure other than a table to track disturb levels. As shown in table 1435, each logical unit (a page, here) has two values which track the disturb in the two memory arrays 1410 and 1420 having different disturb regions. The values are marked "_p1" and "_p2" to correspond to the different disturb profiles of memory arrays 1410 and 1420. If the logical unit spans additional memory arrays with additional different disturb regions, controller 115 or DMC 130 can track additional values, one for each different disturb region.

For simplicity, the initial state of all of the disturb levels is set to zero. The first operation is a write to page 1. DMC 130 identifies the location of page 1 as the aggressor, identifies the locations of pages 0 and 2 as the victims in memory array 1410 and page 4 as the victim in memory array 1420, and updates the disturb values associated with the victims by the adjustment amounts resulting in the disturb values shown in column 1435A.

The next operation is a write to page 7. DMC 130 identifies the location of page 7 as the aggressor, identifies the locations of pages 6 and 8 as the victims in memory array 1410 and page 4 as the victim in memory array 1420, and updates the disturb values associated with the victims by the adjustment amounts resulting in the disturb values shown in column 1435B.

The next operation is a write to page 3. DMC 130 identifies the location of page 3 as the aggressor, identifies the locations of page 3 as the victim in memory array 1410 and pages 0 and 6 as the victims in memory array 1420, and updates the disturb values associated with the victims by the adjustment amounts resulting in the disturb values shown in column 1435C.

It will be apparent from this description that aspects of the inventions may be embodied, at least in part, in software. That is, a computer system or other data processing system, such as controller 115, may carry out the computer-implemented methods 900 and 1300 in response to its processor executing sequences of instructions contained in a memory or other non-transitory machine-readable storage medium. The software may further be transmitted or received over a network (not shown) via a network interface. In various embodiments, hardwired circuitry may be used in combination with the software instructions to implement the present embodiments. It will also be appreciated that additional components, not shown, may also be part of memory system 110, and, in some embodiments, fewer components than that shown in FIG. 1 may also be used in memory system 110.

An article of manufacture may be used to store program code providing at least some of the functionality of the embodiments described above. Additionally, an article of manufacture may be used to store program code created using at least some of the functionality of the embodiments described above. An article of manufacture that stores program code may be embodied as, but is not limited to, one or more memories (e.g., one or more flash memories, random access memories—static, dynamic, or other), optical disks, CD-ROMs, DVD-ROMs, EPROMs, EEPROMs, magnetic or optical cards or other type of non-transitory machine-readable media suitable for storing electronic instructions. Additionally, embodiments of the invention may be implemented in, but not limited to, hardware or firmware utilizing an FPGA, ASIC, a processor, a computer, or a computer system including a network. Modules and components of hardware or software implementations can be divided or combined without significantly altering embodiments of the invention.

In the foregoing specification, the invention has been described with reference to specific exemplary embodiments thereof. Various embodiments and aspects of the invention(s) are described with reference to details discussed in this document, and the accompanying drawings illustrate the various embodiments. The description above and drawings are illustrative of the invention and are not to be construed as limiting the invention. References in the specification to "one embodiment," "an embodiment," "an exemplary embodiment," etc., indicate that the embodiment described may include a particular feature, structure, or characteristic, but not every embodiment may necessarily include the particular feature, structure, or characteristic. Moreover, such phrases are not necessarily referring to the same embodiment. Furthermore, when a particular feature, structure, or characteristic is described in connection with an embodiment, such feature, structure, or characteristic may be implemented in connection with other embodiments whether or not explicitly described. Additionally, as used in this document, the term "exemplary" refers to embodiments that serve as simply an example or illustration. The use of exemplary should not be construed as an indication of preferred examples. Blocks with dashed borders (e.g., large dashes, small dashes, dot-dash, dots) are used to illustrate optional operations that add additional features to embodiments of the invention. However, such notation should not be taken to mean that these are the only options or optional operations, and/or that blocks with solid borders are not optional in some embodiments of the invention. Numerous specific details are described to provide a thorough understanding of various embodiments of the present invention. However, in certain instances, well-known or conventional details are not described in order to provide a concise discussion of embodiments of the present inventions.

It will be evident that various modifications may be made thereto without departing from the broader spirit and scope of the invention as set forth in the following claims. For example, the methods described in this document may be performed with fewer or more features/blocks or the features/blocks may be performed in differing orders. Additionally, the methods described in this document may be repeated or performed in parallel with one another or in parallel with different instances of the same or similar methods.

What is claimed is:

1. A computer-implemented method, comprising:
    detecting a memory access at an aggressor memory address of a memory device comprising at least one memory die, wherein the aggressor is within a first memory array of the memory device that extends in a first dimension and in a second dimension;
    identifying a victim based upon the aggressor memory address; and
    updating a disturb value for the victim, wherein an amount the disturb value is updated is based upon whether the victim is adjacent to the aggressor in the first dimension or the second dimension.

2. The computer-implemented method of claim 1, wherein the amount of the disturb value when the victim is adjacent to the aggressor in the first dimension is a non-zero number and the amount of the disturb value when the victim is adjacent to the aggressor in the second dimension is zero.

3. The computer-implemented method of claim 2, wherein, for a second memory array of the memory device, an amount of a disturb value for a second victim that is adjacent to a second aggressor in the second dimension is a non-zero number and the amount of the disturb value for the second victim when that is adjacent to the second aggressor in the first dimension is zero.

4. The computer-implemented method of claim 1, wherein the amount of the disturb value is further based on whether the memory operation is a read operation or a write operation.

5. The computer-implemented method of claim 1, further comprising:
    resetting a disturb level associated with the aggressor.

6. The computer-implemented method of claim 1, further comprising:
    in response to determining that a group of memory cells including the victim has an elevated error rate, moving data from the victim to a new memory location.

7. The method of claim 1, wherein the victim belongs to a group of memory elements and wherein the amount of the disturb value is further based on the number of memory elements in the group.

8. A non-transitory computer-readable storage medium storing instructions, which when executed by a processing device, cause the processing device to:
    detect a memory access at an aggressor memory address of a memory device comprising at least one memory die, wherein the aggressor is within a first memory array of the memory device that extends in a first dimension and in a second dimension;
    identify a victim based upon the aggressor memory address; and
    update a disturb value for the victim, wherein an amount the disturb value is updated is based upon whether the victim is adjacent to the aggressor in the first dimension or the second dimension.

9. The non-transitory computer-readable storage medium of claim 8, wherein the amount of the disturb value when the victim is adjacent to the aggressor in the first dimension is a non-zero number and the amount of the disturb value when the victim is adjacent to the aggressor in the second dimension is zero.

10. The non-transitory computer-readable storage medium of claim 9, wherein, for a second memory array of the memory device, an amount of a disturb value for a second victim that is adjacent to a second aggressor in the second dimension is a non-zero number and the amount of the disturb value for the second victim when that is adjacent to the second aggressor in the first dimension is zero.

11. The non-transitory computer-readable storage medium of claim 8, wherein the amount of the disturb value is further based on whether the memory operation is a read operation or a write operation.

12. The non-transitory computer-readable storage medium of claim 8, wherein the processing device is further to:
    reset a disturb level associated with the aggressor.

13. The non-transitory computer-readable storage medium of claim 8, wherein the processing device is further to:
    in response to determining that a group of memory cells including the victim has an elevated error rate, moving data from the victim to a new memory location.

14. The non-transitory computer-readable storage medium of claim 8, wherein the victim belongs to a group of memory elements and wherein the amount of the disturb value is further based on the number of memory elements in the group.

15. A system comprising:
    a memory device comprising at least one memory die; and
    a processing device, operatively coupled with the memory device, to:
        detect a memory access at an aggressor memory address of the memory device, wherein the aggressor is within a first memory array of the memory device that extends in a first dimension and in a second dimension;

identify a victim based upon the aggressor memory address; and update a disturb value for the victim, wherein an amount the disturb value is updated is based upon whether the victim is adjacent to the aggressor in the first dimension or the second dimension and whether the memory operation is a read operation or a write operation.

16. The system of claim 15, wherein the amount of the disturb value when the victim is adjacent to the aggressor in the first dimension is a non-zero number and the amount of the disturb value when the victim is adjacent to the aggressor in the second dimension is zero.

17. The system of claim 16, wherein, for a second memory array of the memory device, an amount of a disturb value for a second victim that is adjacent to a second aggressor in the second dimension is a non-zero number and the amount of the disturb value for the second victim when that is adjacent to the second aggressor in the first dimension is zero.

18. The system of claim 15, wherein the processing device is further to:

reset a disturb level associated with the aggressor.

19. The system of claim 15, wherein the processing device is further to:

in response to determining that a group of memory cells including the victim has an elevated error rate, moving data from the victim to a new memory location.

20. The system of claim 15, wherein the victim belongs to a group of memory elements and wherein the amount of the disturb value is further based on the number of memory elements in the group.

* * * * *